US012204823B1

(12) United States Patent
Capell et al.

(10) Patent No.: US 12,204,823 B1
(45) Date of Patent: Jan. 21, 2025

(54) GENERATING PERCEPTION SCENARIOS FOR AN AUTONOMOUS VEHICLE FROM SIMULATION DATA

(71) Applicant: Aurora Innovation, Inc., Palo Alto, CA (US)

(72) Inventors: Steven Keith Capell, San Francisco, CA (US); Simon Box, San Francisco, CA (US); John Michael Wyrwas, Cupertino, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 747 days.

(21) Appl. No.: 17/119,240

(22) Filed: Dec. 11, 2020

Related U.S. Application Data

(60) Provisional application No. 62/988,310, filed on Mar. 11, 2020.

(51) Int. Cl.
*G06F 30/17* (2020.01)
*G05D 1/00* (2006.01)
*G06F 30/20* (2020.01)
*G06N 5/04* (2023.01)
*G06N 20/00* (2019.01)

(52) U.S. Cl.
CPC ........... *G06F 30/20* (2020.01); *G05D 1/0221* (2013.01); *G06N 5/04* (2013.01); *G06N 20/00* (2019.01); *G05D 1/0231* (2013.01); *G05D 1/0242* (2013.01); *G05D 1/0257* (2013.01)

(58) Field of Classification Search
CPC .... G06F 30/20; G05D 1/0221; G05D 1/0231; G05D 1/0242; G05D 1/0257; G06N 5/04; G06N 20/00
See application file for complete search history.

(56) References Cited

U.S. PATENT DOCUMENTS

| 7,827,011 B2 | 11/2010 | DeVaul et al. |
| 8,036,842 B2 | 10/2011 | DeVaul et al. |
| 9,720,415 B2 | 8/2017 | Levinson et al. |
| 9,836,895 B1 | 12/2017 | Stout |

(Continued)

FOREIGN PATENT DOCUMENTS

| WO | 2019199880 A1 | 10/2019 |
| WO | 2022251692 A1 | 12/2022 |

OTHER PUBLICATIONS

Krajewski, Robert, et al. "The highd dataset: A drone dataset of naturalistic vehicle trajectories on german highways for validation of highly automated driving systems." 2018 21st international conference on intelligent transportation systems (ITSC). IEEE, 2018.*

(Continued)

*Primary Examiner* — Nithya J. Moll
(74) *Attorney, Agent, or Firm* — PATENT LAW WORKS LLP

(57) ABSTRACT

Simulation data of the autonomous vehicle is processed by executing a simulation based on the simulation data to generate a simulation result. Then a perception scenario is generated from the simulation result. The generated perception scenario is validated by verifying whether a constraint is satisfied to produce a validated perception scenario. The validated perception scenario can be used to create or refine a perception model used for controlling the operation of autonomous vehicles.

20 Claims, 9 Drawing Sheets

(56) References Cited

U.S. PATENT DOCUMENTS

| | | | |
|---|---|---|---|
| 10,019,011 B1* | 7/2018 | Green | G05D 1/0088 |
| 10,185,999 B1 | 1/2019 | Konrardy et al. | |
| 10,255,168 B2 | 4/2019 | Stefan et al. | |
| 10,831,202 B1 | 11/2020 | Askeland et al. | |
| 10,915,762 B1 | 2/2021 | Russell | |
| 11,086,319 B2 | 8/2021 | Valois et al. | |
| 11,087,477 B2 | 8/2021 | Choi | |
| 11,200,359 B2 | 12/2021 | Wyrwas | |
| 11,562,556 B1 | 1/2023 | Kabzan | |
| 2017/0123428 A1 | 5/2017 | Levinson et al. | |
| 2017/0371348 A1 | 12/2017 | Mou | |
| 2018/0136644 A1 | 5/2018 | Levinson et al. | |
| 2018/0275658 A1 | 9/2018 | Iandola et al. | |
| 2019/0025841 A1* | 1/2019 | Haynes | G05D 1/0214 |
| 2019/0129436 A1 | 5/2019 | Sun et al. | |
| 2019/0152492 A1 | 5/2019 | el Kaliouby et al. | |
| 2019/0303759 A1 | 10/2019 | Farabet et al. | |
| 2020/0005631 A1 | 1/2020 | Visintainer et al. | |
| 2020/0074230 A1 | 3/2020 | Englard et al. | |
| 2020/0082034 A1 | 3/2020 | Sholingar | |
| 2020/0097007 A1 | 3/2020 | Dyer et al. | |
| 2020/0125112 A1 | 4/2020 | Mao et al. | |
| 2020/0150665 A1 | 5/2020 | Refaat et al. | |
| 2020/0183387 A1 | 6/2020 | Teit et al. | |
| 2020/0293054 A1 | 9/2020 | George et al. | |
| 2021/0018916 A1 | 1/2021 | Thakur et al. | |
| 2021/0103742 A1 | 4/2021 | Adeli-Mosabbeb et al. | |
| 2021/0146919 A1 | 5/2021 | Xu et al. | |
| 2021/0263152 A1 | 8/2021 | Halder | |
| 2021/0309248 A1 | 10/2021 | Choe | |
| 2021/0403035 A1 | 12/2021 | Danna | |
| 2022/0116052 A1 | 4/2022 | Silberman | |
| 2022/0126864 A1 | 4/2022 | Moustafa | |
| 2022/0153314 A1 | 5/2022 | Suo | |
| 2022/0318464 A1 | 10/2022 | Xu | |
| 2022/0335624 A1 | 10/2022 | Maurer | |
| 2022/0366494 A1 | 11/2022 | Cella | |

OTHER PUBLICATIONS

Zhu, Meixin, Xuesong Wang, and Yinhai Wang. "Human-like autonomous car-following model with deep reinforcement learning." Transportation research part C: emerging technologies 97 (2018): 348-368. (Year: 2018).*

International Search Report and Written Opinion for PCT/US2021/021878, mailed Jun. 22, 2021, 15 pgs.

International Preliminary Report on Patentability for PCT/US2021/021878, mailed Sep. 22, 2022, 9 pgs.

Communication Pursuant to Rules 161(1) and 162 EPC for European Patent Application No. 21715441.8, dated Oct. 18, 2022, 3 pgs.

Queiroz, Rodrigo et al., "GeoScenario: an Open DSL for Autonomous Driving Scenario Representation", 2019 IEEE Intelligent Vehicles Symposium (IV), Jun. 9-12, 2019, 8 pgs.

Product Marketing, "Autonomous Vehicle Modeling & Simulation", https://simulatemore.mscsoftware.com/autonomous-vehicle-modeling-simulation/, Jul. 17, 2018, retrieved Jan. 10, 2020, 7 pgs.

Southward, Charles M. II, "Autonomous Convoy Study of Unmanned Ground Vehicles Using Visual Snakes", Master's Thesis Submitted to the Faculty of the Virginia Polytechnic Institute and State University, May 1, 2007, 78 pgs.

Rosique, Francisca et al., "A Systematic Review of Perception System and Simulators for Autonomous Vehicles Research", Sensors 2019, 19, 648; doi:10.3390/s19030648, Feb. 5, 2019, 29 pgs.

Huang, Wu ling, et al. "Autonomous vehicles testing methods review." 2016 IEEE 19th International Conference on Intelligent Transportation Systems (ITSC). IEEE, 2016.

Rosique, Francisca, et al. "A systematic review of perception system and simulators for autonomous vehicles research." Sensors 19.3 (2019): 648.

* cited by examiner

GENERATING PERCEPTION SCENARIOS FOR AN AUTONOMOUS VEHICLE FROM SIMULATION DATA

CROSS-REFERENCE TO RELATED APPLICATIONS

This application claims priority to U.S. Provisional Application Ser. No. 62/988,310, filed Mar. 11, 2020, titled "Generating Perception Scenarios for an Autonomous Vehicle from Simulation Data", which is hereby incorporated herein in its entirety by this reference.

BACKGROUND

A challenge to autonomous vehicle technology arises in acquiring a sufficient quantity and quality of training data to accurately represent a wide variety of driving conditions and scenarios. This training data is used to train the machine learning models used for different systems in the autonomous vehicle, for example, the perception or planning subsystems. One problem is that training of the machine learning models requires a very large amount of data, and just capturing sensor data from operation of autonomous vehicles does not provide enough data. Some approaches have tried to use simulation data for training the machine learning models to address this data quantity issue. For example, some have used simulation data obtained from the execution of simulators that operate similar to video games. However, the problem with that approach is that the data provided by such simulators is not of high enough quality and does not provide an accurate representation of real-world driving conditions. A particular problem is generating perception scenarios and updating perception systems based on perception scenarios.

SUMMARY

This specification relates to methods and systems for generating perception scenarios from simulation data or logged data. According to one aspect of the subject matter described in this disclosure, a method includes receiving simulation data of the autonomous vehicle, executing a perception simulation based on the simulation data to generate a simulation result, generating a perception scenario from the simulation result, and validating the perception scenario by verifying whether a constraint is satisfied to produce a validated perception scenario.

In general, another aspect of the subject matter described in this disclosure includes a system comprising one or more processors and memory operably coupled with the one or more processors, wherein the memory stores instructions that, in response to the execution of the instructions by one or more processors, cause the one or more processors to perform the following operations of receiving simulation data of the autonomous vehicle, executing a perception simulation based on the simulation data to generate a simulation result, generating a perception scenario from the simulation result, and validating the perception scenario by verifying whether a constraint is satisfied to produce a validated perception scenario.

Other implementations of one or more of these aspects include corresponding systems, apparatus, and computer programs, configured to perform the actions of the methods, encoded on computer storage devices.

These and other implementations may each optionally include one or more of the following features. For instance, the method further comprises providing the validated perception scenario as a training input to a machine learning engine to generate a perception model and a predicted output of the perception model, and updating one or more weights in the perception model based on a difference between the predicted output and the simulated result. For instance, features may also include the perception scenario is for a lidar sensor of the autonomous vehicle, and the perception model is for the lidar sensor, the perception scenario is for a radar sensor of the autonomous vehicle and the perception model is for the radar sensor, the perception scenario is for a camera of the autonomous vehicle and the perception model is for the camera, or the perception scenario is for a plurality of sensors of the autonomous vehicle, and the plurality of sensors are from a group of a lidar sensor, a radar sensor and a camera. In general, other aspects of the subject matter of this disclosure may be implemented in methods where validating the perception scenario includes verifying a tracking constraint, the simulation data is generated from logged sensor data, and the simulation data is generated from data from a simulation or a video game.

BRIEF DESCRIPTION OF THE DRAWINGS

These and other aspects and features of the present implementations will become apparent upon review of the following description of specific implementations in conjunction with the accompanying figures, wherein.

DETAILED DESCRIPTION

Implementations of the disclosure are generally related to the use of simulation data to generate one or more perception scenarios. The simulation data can be produced from logged or real sensor data, data from video games, data from film or data from video. Once the one or more perception scenarios are produced, they can in turn be used to train machine learning models that are used in various subsystems of an autonomous vehicle, for example, the perception, planning, and control subsystems. In particular, the one or more perception scenarios can be used to generate and refine perception models.

Autonomous Vehicle

Figure 1:
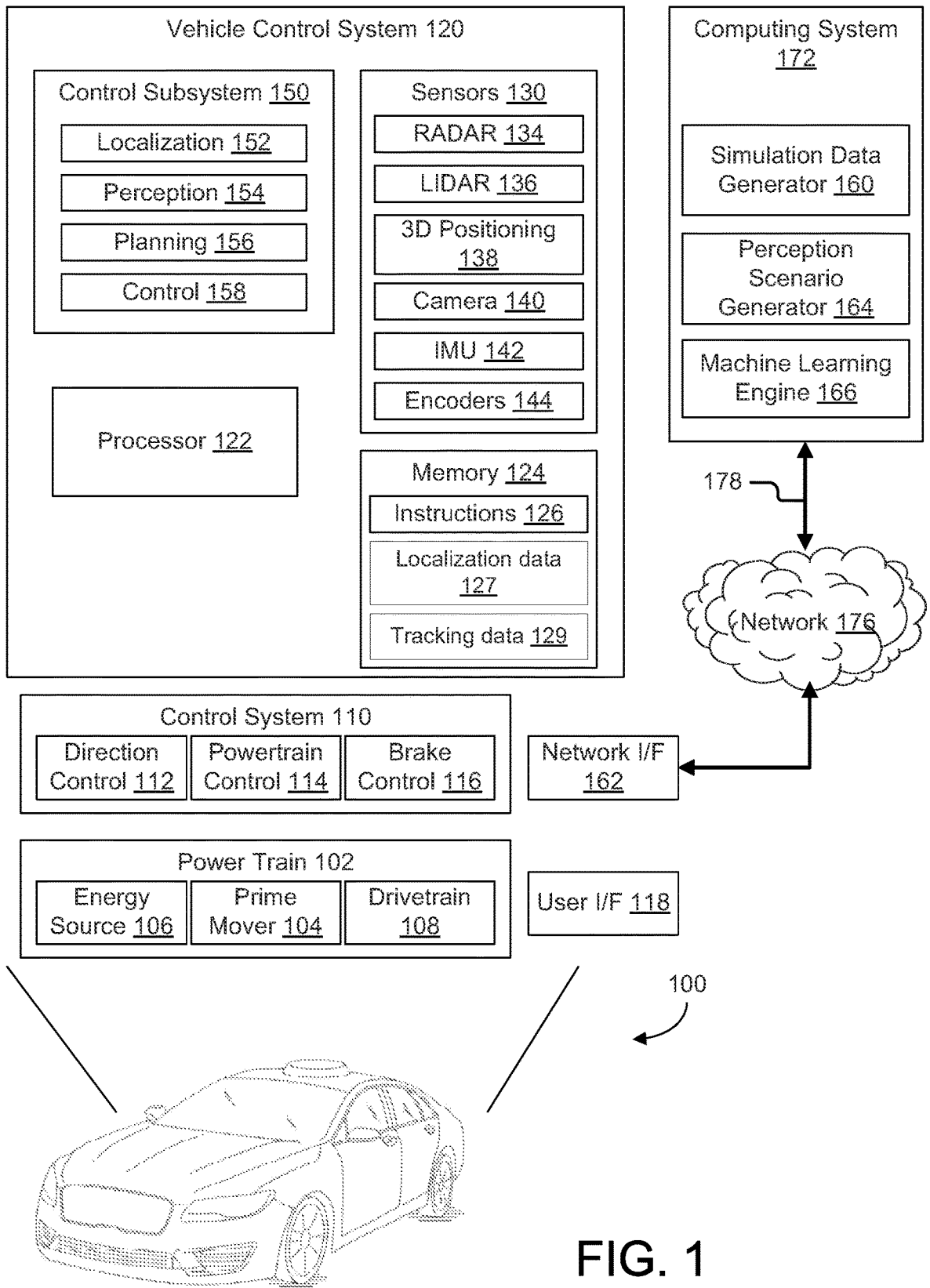
FIG. 1 is a block diagram illustrating an example of a hardware and software environment for an autonomous vehicle according to some implementations.

Referring to the drawings, wherein like numbers denote like parts throughout the several views, FIG. 1 illustrates an example hardware and software environment for an autonomous vehicle within which various techniques disclosed herein may be implemented. The vehicle 100, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 100 may be implemented as any number of different types of vehicles, including vehicles capable of transporting people and/or cargo, and capable of traveling by land, by sea, by air, underground, undersea, and/or in space, and it will be appreciated that the aforementioned components 102-116 may vary widely based upon the type of vehicle within which these components are utilized.

For simplicity, the implementations discussed hereinafter will focus on a wheeled land vehicle such as a car, van, truck, bus, etc. In such implementations, the prime mover 104 may include one or more electric motors and/or an internal combustion engine (among others). The energy source 106 may include, for example, a fuel system (e.g., providing gasoline, diesel, hydrogen, etc.), a battery system, solar panels or other renewable energy source, and/or a fuel cell system. The drivetrain 108 includes wheels and/or tires along with a transmission and/or any other mechanical drive components suitable for converting the output of the prime mover 104 into vehicular motion, as well as one or more brakes configured to controllably stop or slow the vehicle 100 and direction or steering components suitable for controlling the trajectory of the vehicle 100 (e.g., a rack and pinion steering linkage enabling one or more wheels of the vehicle 100 to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in other implementations multiple electric motors (e.g., dedicated to individual wheels or axles) may be used as a prime mover. In the case of a hydrogen fuel cell implementation, the prime mover 104 may include one or more electric motors and the energy source 106 may include a fuel cell system powered by hydrogen fuel.

The direction control 112 may include one or more actuators and/or sensors for controlling and receiving feedback from the direction or steering components to enable the vehicle 100 to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 100. The brake control 116 may be configured to control one or more brakes that slow or stop vehicle 100, e.g., disk or drum brakes coupled to the wheels of the vehicle.

Other vehicle types, including but not limited to airplanes, space vehicles, helicopters, drones, military vehicles, all-terrain or tracked vehicles, ships, submarines, construction equipment etc., will necessarily utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, full or semi-autonomous control over the vehicle 100 is implemented in a vehicle control system 120, which may include one or more processors 122 and one or more memories 124, with each processor 122 configured to execute program code instructions 126 stored in a memory 124. The processors(s) can include, for example, graphics processing unit(s) ("GPU(s)")) and/or central processing unit(s) ("CPU(s)").

Sensors 130 may include various sensors suitable for collecting information from a vehicle's surrounding environment for use in controlling the operation of the vehicle 100. For example, sensors 130 can include RADAR sensor 134, LIDAR (Light Detection and Ranging) sensor 136, a 3D positioning sensor 138, e.g., a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can optionally include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle 100 in three directions. One or more encoders 144, such as wheel encoders may be used to monitor the rotation of one or more wheels of vehicle 100.

The outputs of sensors 130 may be provided to a set of control subsystems 150, including, a localization subsystem 152, a perception subsystem 154, a planning subsystem 156, and a control subsystem 158. The localization subsystem 152 is principally responsible for precisely determining the location and orientation (also sometimes referred to as "pose") of the vehicle 100 within its surrounding environment, and generally within some frame of reference. The perception subsystem 154 is principally responsible for detecting, tracking, and/or identifying objects within the environment surrounding vehicle 100. A machine learning model in accordance with some implementations can be utilized in tracking objects. The planning subsystem 156 is principally responsible for planning a trajectory or a path of motion for vehicle 100 over some timeframe given a desired destination as well as the static and moving objects within the environment. A machine learning model in accordance with some implementations can be utilized in planning a vehicle trajectory. The control subsystem 158 is principally responsible for generating suitable control signals for controlling the various controls in the vehicle control system 120 in order to implement the planned trajectory of the vehicle 100. Similarly, a machine learning model can be utilized to generate one or more signals to control the autonomous vehicle 100 to implement the planned trajectory.

It will be appreciated that the collection of components illustrated in FIG. 1 for the vehicle control system 120 is merely one example. Individual sensors may be omitted in some implementations. Additionally, or alternatively, in some implementations, multiple sensors of the same types illustrated in FIG. 1 may be used for redundancy and/or to cover different regions around a vehicle. Moreover, there may additional sensors of other types beyond those described above to provide actual sensor data related to the operation and environment of the wheeled land vehicle.

Likewise, different types and/or combinations of control subsystems may be used in other implementations. Further, while subsystems 152-158 are illustrated as being separate from processor 122 and memory 124, it will be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 100 may also include a secondary vehicle control system (not illustrated), which may be used as a redundant or backup control system for the vehicle 100. In some implementations, the secondary vehicle control system may be capable of fully operating the autonomous vehicle 100 in the event of an adverse event in the vehicle control system 120, while in other implementations, the secondary vehicle control system may only have limited functionality, e.g., to perform a controlled stop of the vehicle 100 in response to an adverse event detected in the primary vehicle control system 120. In still other implementations, the secondary vehicle control system may be omitted.

In general, an innumerable number of different architectures, including various combinations of software, hardware, circuit logic, sensors, networks, etc. may be used to implement the various components illustrated in FIG. 1. Each processor may be implemented, for example, as a microprocessor and each memory may represent the random access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 100, e.g., any cache memory in a processor, as well as any storage capacity used as a virtual memory, e.g., as stored on a mass storage device or another computer controller. One or more processors 122 illustrated in FIG. 1, or entirely separate processors, may be used to implement additional functionality in the vehicle 100 outside of the purposes of autonomous control, e.g., to control entertainment systems, to operate doors, lights, convenience features, etc.

In addition, for additional storage, the vehicle 100 may include one or more mass storage devices, e.g., a removable disk drive, a hard disk drive, a direct access storage device ("DASD"), an optical drive (e.g., a CD drive, a DVD drive, etc.), a solid state storage drive ("SSD"), network attached storage, a storage area network, and/or a tape drive, among others.

Furthermore, the vehicle 100 may include a user interface 118 to enable vehicle 100 to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 100 may include one or more network interfaces, e.g., network interface 162, suitable for communicating with one or more networks 176 to permit the communication of information with other computers and electronic devices, including, for example, a central service, such as a cloud service, from which the vehicle 100 receives information including trained machine learning models and other data for use in autonomous control thereof. The one or more networks 176, for example, may be a communication network and include a wide area network ("WAN") such as the Internet, one or more local area networks ("LANs") such as Wi-Fi LANs, mesh networks, etc., and one or more bus subsystems. The one or more networks 176 may optionally utilize one or more standard communication technologies, protocols, and/or inter-process communication techniques. In some implementations, data collected by the one or more sensors 130 can be uploaded to a computing system 172 via the network 176 for additional processing.

In the illustrated implementation, the vehicle 100 may communicate via the network 176 and signal line 178 with a computing device 172 for the purposes of implementing various functions described below for generating one or more perception scenarios, and generating and refining perception models. In some implementations, the computing device 172 is a cloud-based computing device. As described below in more detail with reference to FIGS. 2 and 3, the computing device 172 includes a simulation data generator 160, a perception scenario generator 164, and a machine learning engine 166. In some implementations not shown in FIG. 1, the simulation data generator 160 and/or the perception scenario generator 164 may be configured and executed on a combination of the computing system 172 and the vehicle control system 120 of the vehicle 100. For example, the simulation data generator 160 (not shown) may execute some functionality on the vehicle control system 120 of the vehicle 100 while the simulation data generator 160 (shown) executes the remaining functionality on the computing system 172. Similarly, the perception scenario generator 164 (not shown) may execute some functionality on the vehicle control system 120 of the vehicle 100 while the perception scenario generator 164 (shown) executes the remaining functionality on the computing system 172. In other implementations, either the computing system 172 or the vehicle control system 120 of the vehicle 100 alone executes the functionality of the simulation data generator 160 and/or the perception scenario generator 164. For example, in some implementations, the simulation data generator 160 operates on the computing system 172 to received logged data from the memory 124 and generate simulation data and the perception scenario generator 164 generates one or more perception scenarios that can be used to by the machine learning engine 166. The machine learning engine 166, operable on the computing system 172, generates a machine learning model, a perception model, based on the one or more perception scenarios. The machine learning model is sent from the computing system 172 to vehicle 100 to be used in the appropriate control subsystem 152-158 for use in performing its respective function. More specifically, the perception model is sent from the computing system 172 to vehicle 100 to be used in the perception subsystem 154.

Each processor illustrated in FIG. 1, as well as various additional controllers and subsystems disclosed herein, generally operates under the control of an operating system and executes or otherwise relies upon various computer software applications, components, programs, objects, modules, data structures, etc., as will be described in greater detail below. Moreover, various applications, components, programs, objects, modules, etc. may also execute on one or more processors in another computer (e.g., computing system 172) coupled to vehicle 100 via network 176, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, will be referred to herein as "program code." Program code typically comprises one or more instructions that are resident at various times in various memory and storage devices, and that, when read and executed by one or more processors, perform the steps necessary to execute steps or elements embodying the various aspects of the present disclosure. Moreover, while implementations have and hereinafter will be described in the context of fully functioning computers and systems, it will be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The example environment illustrated in FIG. 1 is not intended to limit implementations disclosed herein. Indeed, other alternative hardware and/or software environments may be used without departing from the scope of implementations disclosed herein.

Computing System 172

In some implementations, the computing system 172 receives a time-stamped log of vehicle data from the vehicle control system 120. A time stamp can be added to each instance of vehicle data prior to uploading to computing system 172. The logged data may include raw sensor data from any one or more of the sensors 130, state or localization data from localization subsystem 152, state or perception data from perception subsystem 154, state or planning data from the planning subsystem 156 or state or control data from the control subsystem 158. The logged data may optionally include other vehicle sensor data, logged sensor data, environmental data or identification data.

As examples, each instance of time-series log sensor data may include information on a location, orientation, and speed of the autonomous vehicle 100. The tracking data for each instance of the time-series logged data may include tracking of objects external to the autonomous vehicle describing their position(s), extent(s), orientation(s) categories, speed(s), and other tracking data or tracking predictions. Information on static objects (e.g., highway signs, road surfaces, etc.) may also be logged. In some implementations, other forms of environmental data may also be logged (e.g., weather conditions, lighting conditions, visibility, etc.)

The logged data may be used as a source of data to aid in generating simulation scenarios. For example, in some implementations, an individual simulation scenario describes aspects of the motion behavior characteristics of the autonomous vehicle 100 (an ego-vehicle) and one or more actors (e.g., other vehicles, static environmental objects, and pedestrians) in an instantiation of a three-dimensional (3D) world within which the autonomous vehicle 100 interacts. In some implementations, an individual simulation may include a variety of simulation scenarios that describe a set of tests of different specific encounters between an autonomous vehicle, its environment, and other actors (e.g., other vehicles, pedestrians, etc.).

Figure 2:
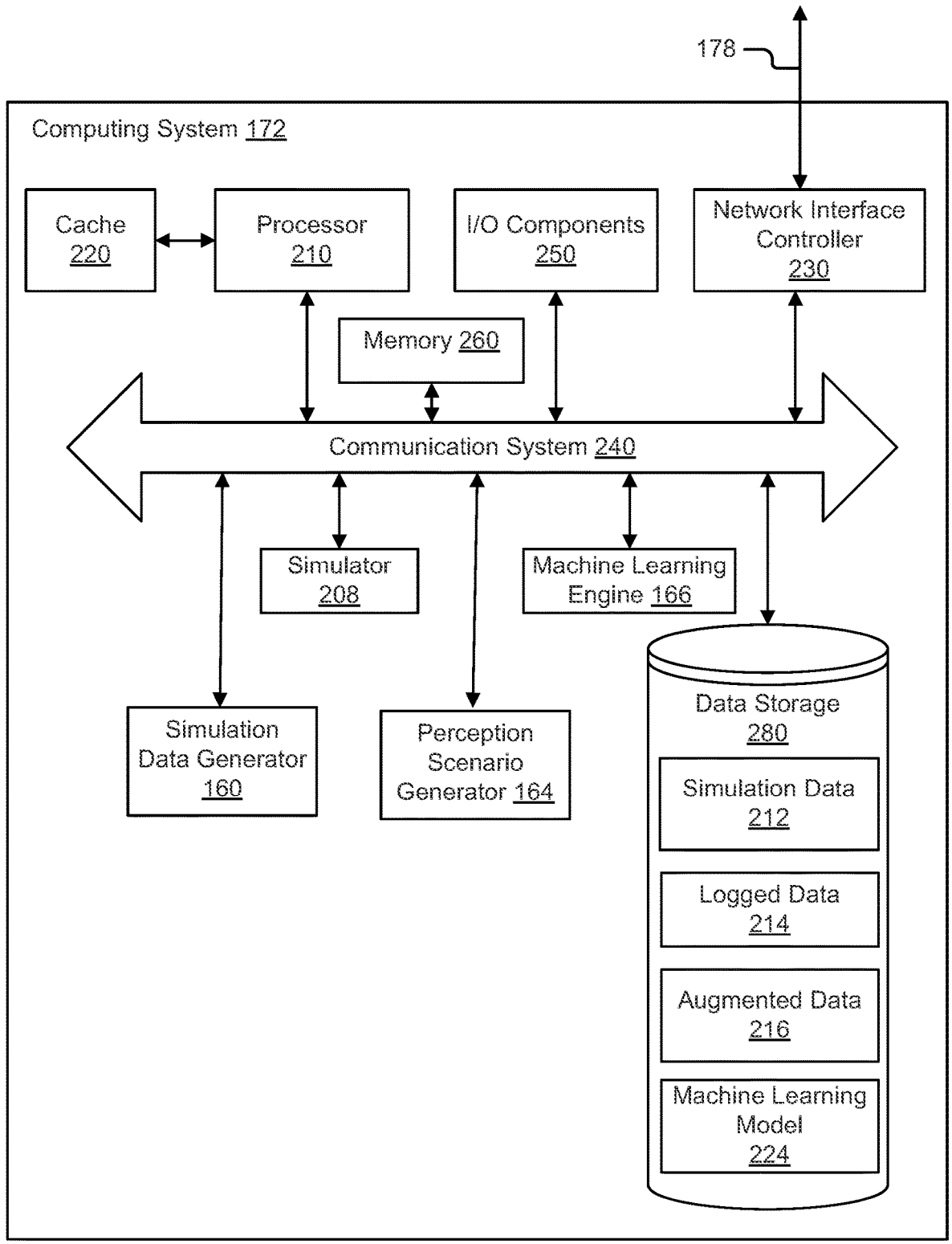
FIG. 2 is a block diagram illustrating a computing system for generating a perception scenario according to some implementations.

FIG. 2 is a block diagram illustrating an example of the computing system 172 for generating simulation scenarios, in particular perception scenarios, according to some implementations of this disclosure. More specifically, the simulation data generator 160 is used, for example, to generate a simulation data. The perception scenario generator 164 uses the simulation data to generate one or more perception scenarios. In some implementations, the machine learning engine 166 may be used, for example, to train a machine learning model 224 using the simulation results of a simulation based on the perception scenario.

Referring to FIG. 2, the illustrated example computing system 172 includes one or more processors 210 in communication, via a communication system 240 (e.g., bus), with memory 260, at least one network interface controller 230 with network interface port for connection to a network (e.g., network 176 via signal line 178), a data storage 280, other components, e.g., an input/output ("I/O") components interface 250 connecting to a display (not illustrated) and an input device (not illustrated), a simulation data generator 160, a simulator 208, a perception scenario generator 164, and a machine learning engine 166.

Generally, the processor(s) 210 will execute instructions (or computer programs) received from memory 260. The processor(s) 210 illustrated incorporate, or are directly connected to, cache memory 220. In some instances, instructions are read from memory 260 into the cache memory 220 and executed by the processor(s) 210 from the cache memory 220. In more detail, the processor(s) 210 may be any logic circuitry that processes instructions, e.g., instructions fetched from the memory 260 or cache 220. In some implementations, the processor(s) 210 are microprocessor units or special purpose processors. The computing device 172 may be based on any processor, or set of processors, capable of operating as described herein. The processor(s) 210 may be single core or multi-core processor(s). The processor(s) 210 may be multiple distinct processors.

The memory 260 may be any device suitable for storing computer readable data. The memory 260 may be a device with fixed storage or a device for reading removable storage media. Examples include all forms of non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray™ discs). A computing system 172 may have any number of memory devices as the memory 260. While the simulation data generator 160, the perception scenario generator 164 and the machine learning engine 166 are illustrated as being separate from processor 210 and memory 260, it will be appreciated that in some implementations, some or all of the functionality of the components 160, 164, and 166 may be implemented with program code instructions resident in the memory 260 and executed by the processor 210.

The cache memory 220 is generally a form of computer memory placed in close proximity to the processor(s) 210 for fast read times. In some implementations, the cache memory 220 is part of, or on the same chip as, the processor(s) 210. In some implementations, there are multiple levels of cache 220, e.g., L2 and L3 cache layers.

The network interface controller 230 manages data exchanges via the network interface (sometimes referred to as network interface ports). The network interface controller 230 handles the physical and data link layers of the OSI model for network communication. In some implementations, some of the network interface controller's tasks are handled by one or more processor(s) 210. In some implementations, the network interface controller 230 is part of a processor 210. In some implementations, a computing system 172 has multiple network interfaces controlled by a single controller 230. In some implementations, a computing system 172 has multiple network interface controllers 230. In some implementations, each network interface is a connection point for a physical network link (e.g., a cat-5 Ethernet link). In some implementations, the network interface controller 230 supports wireless network connections and an interface port is a wireless (e.g., radio) receiver/transmitter (e.g., for any of the IEEE 802.11 protocols, near field communication "NFC", Bluetooth, ANT, WiMAX, 5G, or any other wireless protocol). In some implementations, the network interface controller 230 implements one or more network protocols such as Ethernet. Generally, a computing device 172 exchanges data with other computing devices via physical or wireless links (represented by signal line 178) through a network interface. The network interface may link directly to another device or to another device via an intermediary device, e.g., a network device such as a hub, a bridge, a switch, or a router, connecting the computing device 172 to a data network such as the Internet.

The data storage 280 may be a non-transitory storage device that stores data for providing the functionality described herein. The data storage 280 may store, among other data, simulation data 212, logged data 214, augmented data 216, and a machine learning model (e.g., a perception model) or representation 224, as will be defined below.

The computing system 172 may include, or provide interfaces 250 for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers. Other components may include an I/O interface, external serial device ports, and any additional co-processors. For example, a computing system 172 may include an interface (e.g., a universal serial bus (USB) interface) for connecting input devices, output devices, or additional memory devices (e.g., portable flash drive or external media drive). In some implementations, a computing device 172 includes an additional device such as a co-processor, e.g., a math co-processor can assist the processor 210 with high precision or complex calculations.

As noted above, the example computing system 172 also includes the simulation data generator 160, the simulator 208, the perception scenario generator 164, and the machine learning engine 166 more particularly for generating perception scenarios and perception models. The operations performed by the simulation data generator 160, the simulator 208, the perception scenario generator 164, and the machine learning engine 166 of FIG. 2 may be distributed across multiple computing systems. In some implementations, one or more aspects of the simulation data generator 160, the simulator 208, the perception scenario generator 164, and the machine learning engine 166 may be combined into a single system and/or one or more aspects may be implemented by the computing system 172. The simulation data generator 160, the simulator 208, the perception scenario generator 164, and the machine learning engine 166 in accordance with many implementations may each be implemented in one or more computing devices that communicate, for example, through the communication network 176 or implemented in the cloud.

Simulation Data Generator 160

In some implementations, the computing system 172 includes the simulation data generator 160 to generate simulation data 212 from logged data 214 or combinations of logged data and other non-sensor data 304. In some implementations, the simulation data generator 160 converts the logged data accessible in the logged data 214 of the data storage 280 in different ways to generate simulation data 212. For example, the logged data is used as a source of data that is based on ground level truth about real world driving situations to generate simulation data stored in simulation data 212 of the data storage 280. In many implementations, the simulation data 212 represents an editable source of truth defining a number of simulation scenarios, e.g., perception scenarios. The simulation data may, for example, be used in simulations of a perception subsystem or a planning model. However, more generally, the simulation data 212 could be used for other purposes, such as procedural scene generation as one example. In some implementations, one or more components of an instance of the logged data 214 are used to aid in creating at least one aspect of a simulation scenario. For example, in some implementations, the logged data 214 is used as an aid to generate a description including a behavior, vehicle configuration (e.g., autonomous vehicle location, platform, speed, or orientation), and sensor configuration of autonomous vehicle (e.g., ego vehicle) and the environment including actors (e.g., other vehicles, traffic, pedestrians, and static objects) in a simulation scenario. However, more generally, in some implementations, other information available from the logged data 214 may be used as an aid in generating a simulation scenario. The logged data 214 may be generally used, in some implementations, as a resource to provide a source of real sensor data for a simulation task that requires a source of real sensor data.

In some implementations, the simulation data 212 is used run simulations that, in turn, are used to generate training data for the machine learning engine 166. In some implementations, the trained machine learning model 224 may be used in the autonomous vehicle 100 for performing various autonomous vehicle tasks relating to perception, planning, and control, among other things.

An appropriate dataset of quality training data is needed to learn autonomous vehicle tasks. For example, autonomous vehicle tasks may include control signals indicating a route change action, a planning action, and/or other autonomous vehicle actions which are generated in response to data collected from one or more autonomous vehicle sensors. Waiting for real world sensor data to be gathered for use as training data for autonomous vehicle tasks may take extended periods of time (e.g., months, years, etc.). Additionally, other sources of training data, such as video game engines or video/film data, typically don't provide training data that is realistic.

Generating simulation scenarios based on logged data 214 has an advantage in that the simulation scenarios may be highly realistic because they are based off of logged data 214. Additionally, as described below in more detail, many variations on the simulation scenarios may be generated to increase the variety and quantity of training data. The simulation scenarios generated from logged data 214 may generally be used to simulate an encounter between the autonomous vehicle 100, its surrounding environment, and other entities (i.e., other actors) in the surrounding environment. In some implementations, the logged data 214 may be used to generate variations in simulation scenarios. The simulation scenarios may provide a dataset that includes information to instantiate a three-dimensional world that mimics the motion behavior and sensor configuration of the autonomous vehicle 100, other vehicles (autonomous and/or non-autonomous), and pedestrians, among other things.

As will be described in more detail below with reference to FIG. 3, in some implementations, the simulation data generator 160 comprises a data mapping engine 202, an augmentation engine 204 that generates augmented data 216, and a scenario production engine 206 to generate simulation data from the input data.

Simulator 208

In some implementations, the computing system 172 includes the simulator 208 to use the simulation data 212, run simulations to generate the simulation result. For example, the simulator 208 executes a simulation based on a selected simulation data, in some instances a perception configuration or scenario. For example, the simulation data may correspond to a perception simulation scenario that imitates the operation of the perception subsystem 154 or a planning simulation scenario that imitates the operation of the planning subsystem 156 of the autonomous vehicle 100. In some implementations, the scenario production engine 206 (see FIG. 3 below) sends a simulation identifier to the simulator 208. The simulator 208 uses the simulation identifier to fetch a configuration of a matching simulation scenario from the simulation data 212 and executes a simulation based on the fetched simulation scenario configuration. The simulator 208 may create a run identifier (run ID) to associate with an execution (run) of the simulation. In some implementations, the simulator 208 may create a batch of a plurality of simulation scenario variations and execute the batch in a single execution. In such implementations, the simulator 208 may create a batch identifier (batch ID) to associate with the batch execution. The simulator 208 may generate a simulation result and/or a simulation log during the execution of the simulation and store it in the simulation data 212. In some implementations, the simulation result and/or a simulation log are one or more formatted messages including or encoded with state information of the autonomous vehicle 100 and other actors observed in the simulation. The simulation log may be stored in the database of simulation data 212 storing a historical log of simulation runs indexed by corresponding run ID and/or batch ID. More generally, the simulation result and/or a simulation log may be used as training data for machine learning engine 166.

Perception Scenario Generator 164

In some implementations, the computing system 172 includes the perception scenario generator 164 to produce perception scenarios. For example, the perception scenario generator 164 converts the simulated data 214 to create one or more perception scenarios. In some implementations, the perception scenario generator 164 is coupled to receive the simulated results or message output by the simulator 208 and create one or more perception scenarios. In other implementations, the perception scenario generator 164 is coupled to the data storage 280 and retrieves the simulated results or messages from the simulated data 214 in the data storage 280 to generate the one or more perception scenarios. The perception scenario generator 164 automatically creates one or more perception scenarios from the simulated results. In some implementations, the perception scenario generator 164 also validates the one or more perception scenarios by verifying that a constraint is satisfied to produce a validated perception scenario. For example, the generated perception scenarios can be validated by verifying that the perception scenario satisfies a tracking constraint. Examples of the operation of the perception scenario generator 164 will be described in more detail below with reference to FIG. 3.

Machine Learning Engine 166

In some implementations, the computing system 172 includes a machine learning engine 166 to train a machine learning model 224, e.g., a perception model. As shown in FIG. 2, once the perception scenario generator 164 has generated one or more simulation scenarios suitable for training the machine learning model 224, the machine learning engine 166 may train the machine learning model 224 using the simulation scenarios as training examples. In one implementation, the machine learning model 224 is a neural network model and includes a layer and/or layers of memory units where memory units each have corresponding weights. A variety of neural network models can be utilized including feed forward neural networks, convolutional neural networks, recurrent neural networks, radial basis functions, other neural network models, as well as combinations of several neural networks. Additionally, or alternatively, the machine learning model 224, e.g., perception model, can represent a variety of machine learning techniques in addition to neural networks, for example, support vector machines, decision trees, Bayesian networks, random decision forests, k-nearest neighbors, linear regression, least squares, other machine learning techniques, and/or combinations of machine learning techniques.

One or more machine learning models 224 may be trained for a variety of autonomous vehicle tasks including determining a target autonomous vehicle location, generating one or more signals to control an autonomous vehicle, tracking or identifying objects within the environment of an autonomous vehicle, etc. For example, a neural network model may be trained to identify traffic lights in the environment with the autonomous vehicle 100. As a further example, a neural network model may be trained to predict the make and model of other vehicles in the environment with the autonomous vehicle 100. In many implementations, machine learning models may be trained to perform a single task. In other implementations, machine learning models may be trained to perform multiple tasks.

The machine learning engine 166 may generate training instances from the simulation or perception scenarios to train the machine learning model 224. A training instance can include, for example, an instance of simulated autonomous vehicle data where the autonomous vehicle 100 can detect a stop sign using the simulated sensor data from one or more sensors and a label corresponding to a simulated output corresponding to bringing the autonomous vehicle to a stop in the simulation scenario. The machine learning engine 166 may apply a training instance as input to machine learning model 224. In some implementations, the machine learning model 224 may be trained using any one of at least one of supervised learning (e.g., support vector machines, neural networks, logistic regression, linear regression, stacking, gradient boosting, etc.), unsupervised learning (e.g., clustering, neural networks, singular value decomposition, principle component analysis, etc.), or semi-supervised learning (e.g., generative models, transductive support vector machines, etc.). Additionally, or alternatively, machine learning models in accordance with some implementations may be deep learning networks including recurrent neural networks, convolutional neural networks (CNN), networks that are a combination of multiple networks, etc. For example, the machine learning engine 166 may generate a predicted machine learning model output by applying training input to the machine learning model 224. Additionally, or alternatively, the machine learning engine 166 may compare the predicted machine learning model output with a machine learning model known output (e.g., simulated output in the simulation scenario) from the training instance and, using the comparison, update one or more weights in the machine learning model 224. In some implementations, one or more weights may be updated by backpropagating the difference over the entire machine learning model 224.

The machine learning engine 166 may test a trained machine learning model according to some implementations. The machine learning engine 166 may generate testing instances using the simulation scenarios and the simulated autonomous vehicle in the simulation scenario performing the specific autonomous vehicle task for which the machine learning model 224 is trained. The machine learning engine 166 may apply a testing instance as input to the trained machine learning model 224. A predicted output generated by applying a testing instance to the trained machine learning model 224 may be compared with a known output for the testing instance (i.e., a simulated output observed in the simulation) to update an accuracy value (e.g., an accuracy percentage) for the machine learning model 224.

Figure 3:
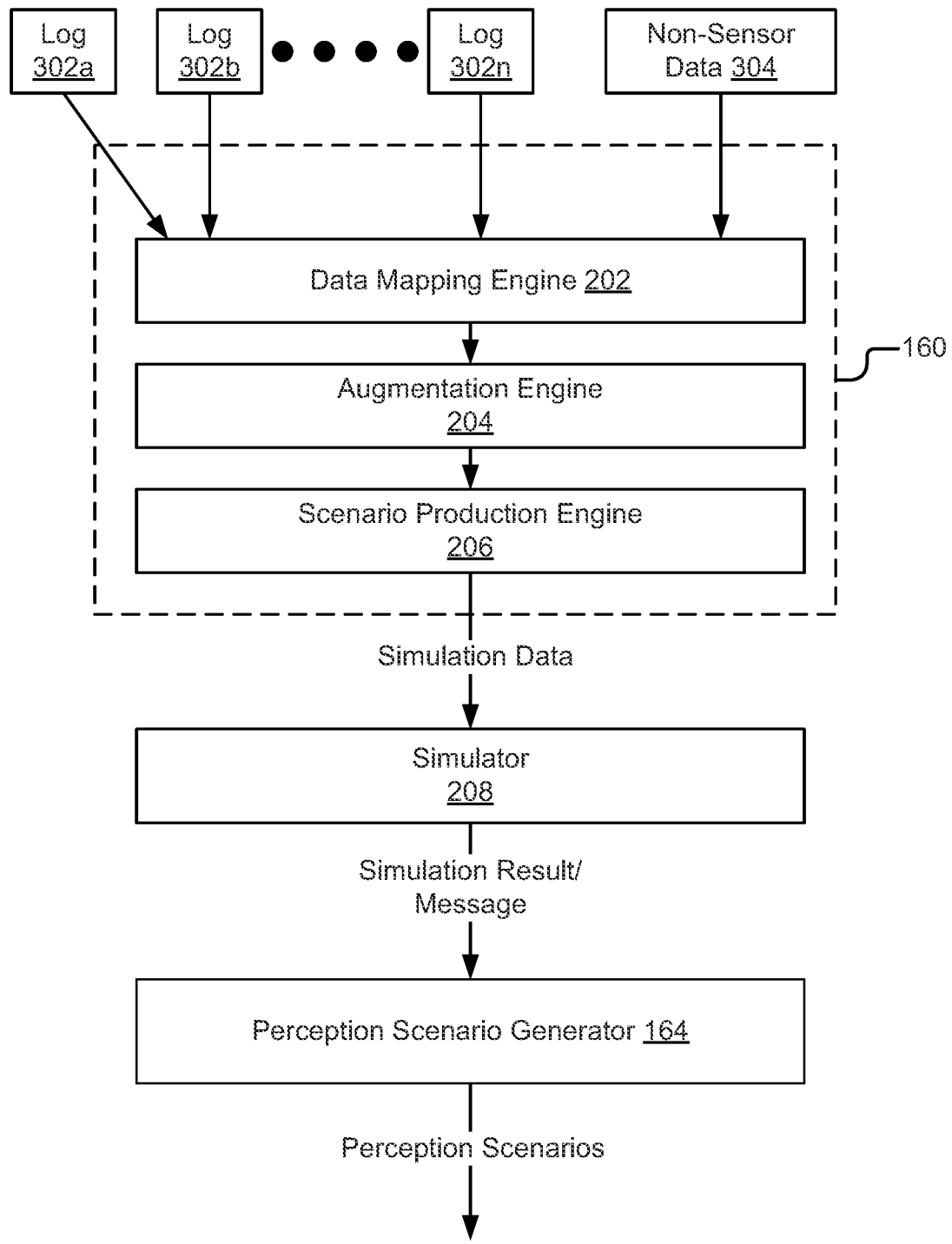
FIG. 3 is a block diagram illustrating operation of a simulation data generator, a simulator, and a perception scenario generator according to some implementations.

As illustrated in FIG. 3, in implementations consistent with the disclosure, the simulation data generator 160 may include: a data mapping engine 202, an augmentation engine 204 that generates augmented data 216, and a scenario production engine 206. The data mapping engine 202, the augmentation engine 204, the scenario production engine 206, the simulator 208, and the perception scenario generator 164 are example components in which techniques described herein may be implemented and/or with which other systems, components, and techniques described herein may interface. The operations performed by one or more engines 202, 204, and 206, the simulator 208, and the perception scenario generator 164 of FIG. 3 may be distributed across multiple computing systems. In some implementations, one or more aspects of engines 202, 204, 206, the simulator 208, and the perception scenario generator 164 may be combined into a single system and/or one or more aspects may be implemented by the computing system 172. Engines 202, 204, 206, the simulator 208, and the perception scenario generator 164 in accordance with many implementations may each be implemented in one or more computing devices that communicate, for example, through the communication network 176.

FIG. 3 also illustrates the data flow through the simulation data generator 160 for the components of the data mapping engine 202, the augmentation engine 204, and the scenario production engine 206. As illustrated in FIG. 3, in some implementations the data mapping engine 202 may select from different snippets 302a, 302b . . . 302n of logged data 214. Additionally, FIG. 3 illustrates one advantage of the present disclosure, that it may generate the simulation scenario from real logged sensor data (e.g., snippets 302a, 302b . . . 302n of logged data) combined with other simulated data from non-sensor data sources 304. In particular, the non-sensor data sources 304 may include data from video games or data from film or video. This non-sensor data, while less realistic, may also be mapped to the same set of global coordinates and be used as an additional source of data. More specifically, the data input to the data mapping engine 202 may be any combination of real logged data, video game data and film data. For example, an individual scenario may be based on sampling a snippet 302 of a much larger set of logged data 214. Snippets 302a, 302b . . . 302n of logged data 214 may be selected for use in generating a simulation scenario in different ways. For example, snippets 302 of logged data may include an identifier or tag identifying portions of the logged data of potential interest for generating simulation scenarios. For example, ID tags may be added, while collecting logged data, to identify one or more of a geography (e.g., San Francisco. New York, etc.), actors (e.g., other vehicles, bicycles, pedestrians, mobility scooters, motorized scooters, etc.), behaviors (e.g., lane change, merge, steering, etc.), location (e.g., four-way stop, intersection, ramp, etc.), status (e.g., deprecated, quarantined, etc.), etc. Alternatively, snippets 302 of logged data may be selected in other ways, such as by using a search tool to search for specific characteristics of portions of the logged data. Other approaches are also possible to select a snippet of logged data, including random selection techniques. Similarly, portions or snippets of the non-sensor data sources 304 may labeled with the same identifiers or tags based on geography, actors, behaviors, location, status, state, etc.

The data mapping engine 202 may access and process the logged data 214 and perform one or more operations to map the logged data 214 into an initial form that identifies actors, actor types, and actor motion behavior characteristics (e.g., actor trajectories, including actor speed). For example, in some implementations, the logged data 214 includes perception data from a perception subsystem 154 that includes tracks or tracking data that are predictions on directions, shapes, speeds, sizes, and types of tracked objects. The logged data 214 may also include an output of a localization subsystem 152, describing location information for the ego-vehicle.

In some implementations, the data mapping engine 202 maps a time-series sequence of instances of the logged data 214 to a global coordinate system. Optional smoothing of the mapped time-series data may be performed in some implementations to reduce noise. The identified actors may be fit to a movement model to estimate their movement.

In some implementations, the tracking data includes a track ID for each tracked object e.g., a unique ID for a tracked object). The tracking data may, for example, include a track ID, size, type, and bounding box. In some implementations, the data mapping engine 202 identifies actors by determining whether or not a track with an ID that occurs over a sequence of instances of logged data is a unique actor. For example, criteria for determining that a sequence of instances of a track ID is a unique actor may include rules on a minimum number of instances that the track with a particular ID occurs, rules based on a consistency with the track ID repeats in a sequence, etc.

In some implementations, the identified actors are fit to a movement model to estimate their movement. The mapping may include one or more rules to generate an output that identifies a set of actors (e.g., vehicles, pedestrians, and static objects) and actor states. The actor states include actor motion behavior characteristics, for example, an orientation; speed, location in the global coordinate system, pose, and derivatives of the actor (e.g., acceleration). The actor motion behavior characteristics correspond to a trajectory traversed by the actor in an environment about an autonomous vehicle (the ego-vehicle).

Each actor has an associated actor type (e.g., an actor type corresponds to an object type, such as pedestrians; different types of vehicles such as cars, trucks, motorcycles, bicycles; and may also optionally in some implementations include static environmental objects). The actor type may also be considered to be an actor state, in that in some implementations the actor type may be changed, as discussed below in more detail. The output of the mapping may also, in some implementations, identify an ego-vehicle state describing the motion of the ego-vehicle, which in some implementation may include the location, pose, and speed of the ego-vehicle in the global coordinate system.

As shown, once the different snippets 302a, 302b ... 302n of logged data 214 and snippets from the non-sensor data sources 304 are selected and processed by the data mapping engine 202, the data mapping engine 202 sends the data for the identified actors, actor types, and actor motion behavior characteristics to the augmentation engine 204.

The augmentation engine 204 samples the actor states and the ego-vehicle state and generates augmented data. In some implementations, the augmentation engine 204 manipulates the identified actors and actor states (e.g., actor types, and actor motion behavior characteristics, such as the trajectory) to generate variations. The process of manipulating or modifying the actor information may also be called mutation. In some implementations, the output of the augmented engine 204 includes a set of actors, actor types, and associated actor motion behavior characteristics that may have one or more attributes varied in comparison with the original set of actors, actor types, and associated actor motion behavior characteristics. In some implementations, the augmentation engine 204 may be implemented to generate specific mutations in response to configurable input criteria. Other possibilities include generating a wide range of mutations and outputting specific mutations that correspond to configurable input criteria. Some examples of manipulations that may be performed by the augmentation engine 202 include changing a speed or acceleration of an actor(e.g., faster speed, greater acceleration, slower speed, or slower acceleration), changing the actor type, size, or shape, changing an offset position (e.g., a lateral or longitudinal offset) of an actor, changing the trajectory (adding varying signal or noise source) of an actor, changing a path of an actor, digitally adding or deleting actors, changing the motion behavior characteristics or rules governing motion of an actor. In some implementations, the augmentation engine 204 may also modify environment, goals and assumptions. The process of manipulation may also be configured over a configurable range of possible supported variations. Other examples include changing the motion behavior characteristics of an actor in the sense of changing the rules regarding how an actor perceives and interacts with other actors and with the autonomous vehicle 100. For example, a perception range of an actor may be varied. As another example of manipulations, an actor may have different rules governing how intelligently it interacts with other actors or with the ego-vehicle. For example, different rule sets may be applied regarding how actor-vehicles interact with pedestrians. In some implementations, an actor may be a path follower. In some implementations, an actor may be a breadcrumb follower in the sense that it is attracted to an actor's breadcrumb in a simulation scenario. Additionally, many permutations, combinations, and variations of any of the above are possible. The process of manipulation may also be configured over a configurable range of all possible supported variations. For example, a speed of an actor may be manipulated over a range of speeds. The actor type may be manipulated over a range of actor types. The actor size may be manipulated over a range of actor sizes. Lateral or longitudinal offsets may be manipulated over a range of lateral and longitudinal offsets. A noise variance in speed and position along a path may be varied over a range. An actor's perception range may also be varied over a range of perception ranges. Other aspects of the behavioral response of an actor may be varied over a supported range of possibilities, such as a supported range of actor intelligence types. These modifications are all within the scope of the present disclosure. Example implementations of the augmentation engine 204 are described in more detail below with reference to FIG. 4.

Once the augmented data 216 is generated, the augmentation engine 204 then outputs the augmented data 216 to the scenario production engine 206 which generates one or more simulations scenarios. Alternatively, the scenario production engine 206 retrieves the augmented data 216 from data storage 280. The scenario production engine 206 process the augmented data 216 to generate one or more simulation scenarios. In some implementations, a scenario includes information describing one or more actors; an actor type for each actor; and actor motion behavior characteristics for each actor. For example, a typical simulation scenario specifies dynamic motion behavior characteristics including behavior characteristics relevant to how an actor interacts with a simulated autonomous vehicle and other actors in a simulated 3D world. The simulation scenarios may also include the initial conditions, a timeline of significant events and the related environmental conditions, but also the simulator configuration. In some implementations, the scenario production engine 206 generates a platform file describing at least one configuration of an autonomous vehicle and actors. A platform file of a simulation scenario may be implemented in different ways. The platform file may be a single file or a group of files each storing a different type of data as described below. In some implementations, the platform file includes vehicle data describing information on vehicles and other actors in scenario (e.g., actors), calibration data for variables that require calibration required to execute the simulation, assets for machine learning (e.g., resources for machine learning), simulation configuration data that specifies the configuration information for a simulation, and optionally a file management data file for general management functions. In some implementations, the calibration data calibrates an attribute of the ego-vehicle or an actor. The configuration data is used to configure different aspects of simulations. That is, the platform file may include information and code that subsequent simulations use as an aid to generate and execute one or more simulations. For example, a scenario may include an ego-vehicle state describing its speed, an ego-vehicle local pose, actor dynamic states, calibration data (for executing simulations), and configuration data (for executing simulations). For example, a perception system simulation may require calibration data and configuration data for some aspects of the simulation of a particular perception system, such as its LIDAR system. It should be noted in some implementations, the functionality of the perception scenario generator 164 may be performed here by the scenario production engine 206, while in other implementations only a based configuration of a particular perception sensor is defined here and it is augmented by the perception scenario generator 164 as described below. In some implementations, a selectable range of variations in a configuration is supported by the platform file. In addition to configuration information, additional code or instructions may be included in the platform file for use in generating simulations. In some implementations, the platform file includes a configuration file that defines input files, configured variations of targets in the augmented data, metadata tags to define attributes of added actors such as a number of pedestrians, and other information required to generate changes in state in the scenario. In some implementations, the scenario production engine 206 may register a simulation scenario by generating a simulation identifier, assigning the simulation identifier to the simulation scenario, and storing the simulation scenario in the simulation data 212. For example, the simulation identifier may be a globally unique identifier (GUID). The simulation data 212 may be a database storing currently and previously available simulation scenarios indexed by their corresponding simulation identifiers.

The scenario production engine 206 provides the one or more simulations scenarios (simulation data) to the simulator 208 that executes the simulations defined by the one or more simulations scenarios and the execution of the simulator 208 produces simulations results or messages. The execution of the simulator 208 executes the one or more simulations scenarios as has been described above to produce simulation results or messages. These results or message can be stored in the data store 280 for further analysis and/or used as training data. Alternatively, the results or messages can be provided directly to the perception scenario generator 164.

The perception scenario generator 164 retrieves the simulation results or messages stored in the data store 280 or receives them directly from the simulator 208. The perception scenario generator 164 uses the simulation results or messages to create one or more perception scenarios. The perception scenario generator 164 operates similar to the scenario production engine 206 described above, but directed more specifically to perception scenarios. In some implementations, the perception scenarios are used to validate the tracker. Perception scenarios are essentially tracking constraints placed on a log snippet. The constraints must be met for the scenario to pass. While perception scenarios may be created from, and applied to, labeled logs, perception simulation is another source of ground truth and sensor data that can be used to test the tracker and generate perception scenarios. In some implementations, a perception scenario is generated for each simulation of interest. When creating perception scenarios from labeled logs this is an interactive process. A time range is identified, actors are selected, and constraints are chosen. The perception scenario generator 164 advantageously automatically creates one or more perception scenarios from the simulated results. A simulation applying an inclusive constraint to the full extents-trajectory of every actor in the scene may be suitable for many cases. In the case of simulations, ground truth will come from the actor dynamic state instead of labels. A constraint is created for each actor so the process will be automatic. In certain special cases, for example for obstructions, the automatic approach may be limited. If a vehicle is coming out from behind an obstruction, it is not expected to be tracked until it is unobstructed. For such special cases, the constraints can be made automatic by algorithmically determining when an actor is obstructed or not. In some implementations, other types of constraints are created either automatically or interactively. In some implementations, the perception scenario generator 164 also validates the one or more perception scenarios by verifying that a constraint is satisfied to produce a validated perception scenario. For example, the generated perception scenarios can be validated by verifying that the perception scenario satisfies a tracking constraint. The operation of the perception scenario generator 164 will be described in more detail below with reference to FIG. 5.

Figure 4:
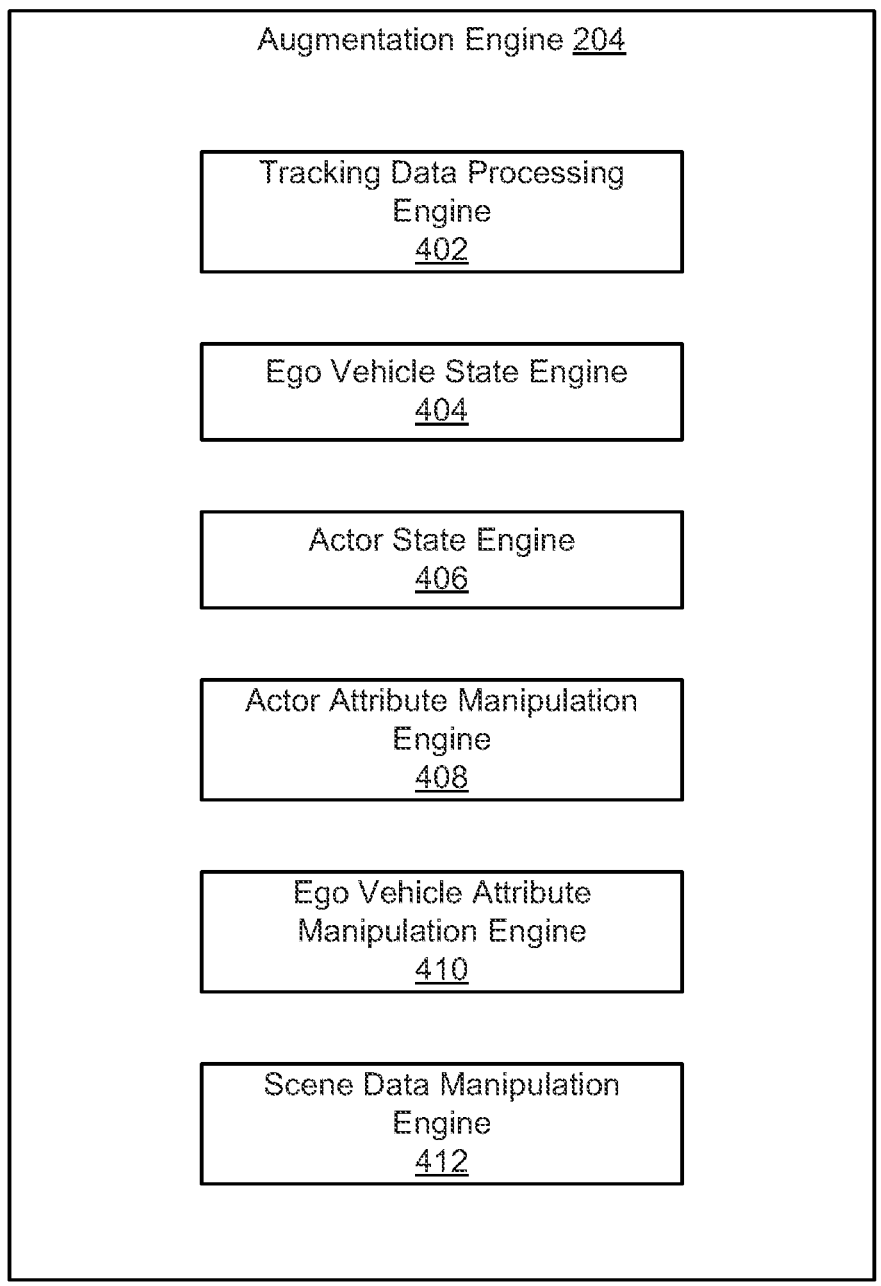
FIG. 4 is a block diagram of an augmentation engine according to some implementations.

Referring now to FIG. 4, an example of the augmentation engine 204 according to some implementations is illustrated. The augmentation engine 204 may include a tracking data processing engine 402, an ego-vehicle state engine 404, an actor state engine 406, an actor attribute manipulation engine 408, an ego-vehicle attribute manipulation engine 410, and a scene data manipulation engine 412. In some implementations, the tracking data processing engine 402 performs an initial identification of actors and actor states from the mapped tracking data. An ego-vehicle state engine 404 is included in some implementations to determine a state of the ego-vehicle, such as an ego-vehicle location, pose, speed, etc. An actor state engine 406 is included in some implementations to manage actor states, such as actors, actor speeds, actor types, etc. An actor attribute manipulation engine 408 is included in some implementations to manipulate actor states and generate variations. Additional optional engines may be provided to perform other types of state manipulation. For example, to the extent that manipulation in ego-vehicle states is desired, such as ego-vehicle speed, an ego-vehicle attribute manipulation engine 410 may be provided to manipulate ego-vehicle states. In some implementations, other aspects of a scene may be manipulated, such as adding sidewalks for pedestrians. A scene data manipulation engine 412 may be provided to implement manipulations of the environment in a scene. From the description above, the processes, changes and modifications that each of these engines 402, 404, 406, 408, 410, 412 make to the data input from the data mapping engine 202 can be easily understood.

Figure 5:
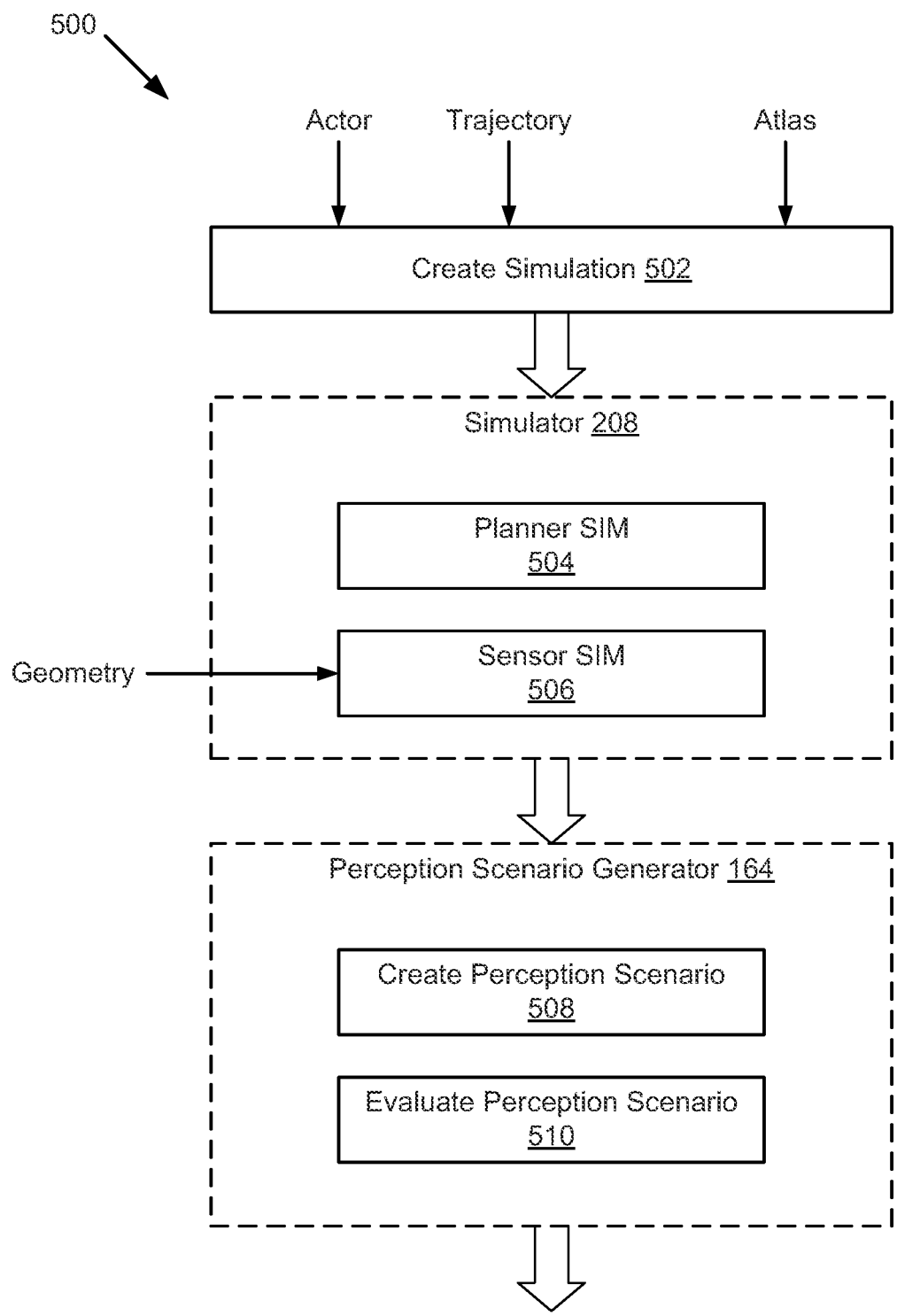
FIG. 5 is a block diagram showing an implementation of the data flow through the simulator and the perception scenario generator in more detail.

Referring now to FIG. 5, a block diagram illustrating an example data flow 500 through the simulator 208 and the perception scenario generator 164 in accordance with the present disclosure will be described. The flow 500 begins with the creation 502 of a simulation. Information about actors, trajectory, and road information are provided and used to create the simulation or simulation scenario. For example, information about one or more actors and the autonomous vehicle 100 are provided. The information for the actors may include a planner for the autonomous vehicle 100, an intelligent driver model, a spline follow or other actor information described above. The trajectory information may include a route or breadcrumbs for a path. The road information may include an atlas, real or synthetic. The scenario production engine 206 uses this information to create the simulation or simulation scenario. In some implementations, the simulation includes a platform file and a python file. The platform file has been described above and may include actor descriptions, ego configuration, an atlas reference, validators, etc., and the python file may specify other aspects of the simulation description.

The simulation (platform file and python file) is provided to and run by the simulator 208. For example, as shown in FIG. 5, the simulator 208 runs a planner simulator 504 using the platform file and python file which generates simulation results in the form of a log file. The log file may include poses, actor states, platform descriptions and other information. The log file is in turn provided to the sensor simulator 506. The sensor simulator 506 may also receive geometry files as shown in FIG. 5. The sensor simulator 506 runs a sensor simulation. For example, the sensor may be a LIDAR sensor. However, it should be understood that in other implementations, the sensor simulator 506 may also be radar, a camera, any other perception sensor, a plurality of sensors of the same type, or other combinations of perception sensors. The sensor simulation executes and the sensor simulator 506 generates an amended log file that is updated to include the sensor data, for example LIDAR data. This amended log file is output by the simulator 208 and provided to the perception scenario generator 164 as shown in FIG. 5.

The perception scenario generator 164 receives the amended log file and uses it to generate one or more perception scenarios. As shown in FIG. 5, the perception scenario generator 164 includes a module 508 to create the perception scenario and a module 510 to evaluate the perception scenario. Module 508 receives the amended log file and uses it to generate one or more perception scenarios. Different implementations for this module 508 are described below. Again, it should be noted that the perception scenarios can be directed to LIDAR, radar, a camera or any other perception sensor even though the example implementations provided below will be described primarily in the context of the sensor being LIDAR.

In first implementation, the perception scenario generator 164, or more particularly, module 508, receives the simulation data 212 or reads it from data storage 280. For example, module 508 receives an index of scenarios in the form of a text file that lists the GUIDs of the scenarios that are to be processed. The perception GUIDs are keys to a database that stores the scenarios. The storage may be storage 280 or may be logged data stored in the cloud. In this first implementation, module 508 runs this data through a perception scenarios evaluation pipeline. For example, the perception scenarios evaluation pipeline has the following stages. First, the simulation stack is executed along with LIDAR simulation and simulated detections. Second, the results in a log file are stored in the cloud. Third, the perception scenario is automatically created from the log file. And finally, a suitably tagged perception scenario is uploaded or stored to a database. After that, the module 510 uses a similar method for processing a simulation scenario but pointing to a different index can be used to evaluate the newly created perception scenario. One particular advantage of this first implementation is that it is able to use existing infrastructure and can be used easily with existing simulation systems only requiring storage of the logs to the cloud. Another advantage is that the simulations are decoupled from their perception scenarios. Once a perception scenario has been created from a simulation it takes on a life of its own and can be used in different ways. Additionally, the simulation (including lidar) has to be done only once, so there is less computation when evaluating perception scenarios.

In a second implementation, the perception scenario generator 164 receives constructs and evaluates perception scenarios all in one fell swoop. The perception scenario generator 164 is able to evaluate the scenarios as they are constructed, without explicitly constructing the entire scenario. Alternatively, the perception scenario generator 164 creates a log file, creates a perception scenario from it, and then evaluates the perception scenario, all locally. In yet another implementation that is a hybrid, the perception scenario generator 164 does not decouple the simulations from their logs as in the first implementation, but uses the logs as a kind of cache, and leverages the perception scenarios infrastructure. This configuration provides the right amount of simulation caching and decoupling, but keeps the logs tied to simulations and can regenerate them at some predefined frequency. This could be accomplished by simply making a new simulation monitor or validator that constructs and evaluates a perception scenario on the fly. The perception scenario generator 164 could then use the existing infrastructure that is used to run and validate simulations, and may use a new stack that includes tracking. Alternatively, an existing perception module that handles the static configuration scenario validation can be used with updated logic to support receiving the same data either constructed on the fly or processed at individual timestamps. This second implementation is particularly advantageous because 1) when doing parameter sweeps, a simulation will generate numerous logs under first implementation, which may be impractical or difficult to manage; 2) the logs will be hard to keep track of and may become stale in the first implementation; 3) there is no need for storage of the log files; and 4) the second implementation provides more regression coverage of simulations.

In a third implementation, the perception scenario generator 164 receives maintains a coupling between simulation and perception scenarios, as in the second implementation just described, but does not run perception simulations as often, and instead stores maintain the connection between logs and simulation results in the simulation data 212 stored in the data store 280, then deletes and recreates the logs on a regular basis.

Regardless of the above implementation used to generate the perception scenarios, once they are generated, they are evaluated by module 510. The perception scenarios are provided to module 510 for execution and evaluation. Module 510 generates perception scenario results. These results can be an indication whether the perception scenarios passed or failed, e.g. satisfied, or did not satisfy a tracking constraint. The results may also include other metrics or data about execution of the perception scenario. As noted throughout this disclosure, the results can be used by the machine learning engine 166 to generate a perception model corresponding to the one or more perception scenarios. In some implementations, if perception scenario 1 fails on a log generated by simulation version 1, and perception scenario 2 passes on a simulation generated by simulation version 2, the two results can be related.

Figure 6:
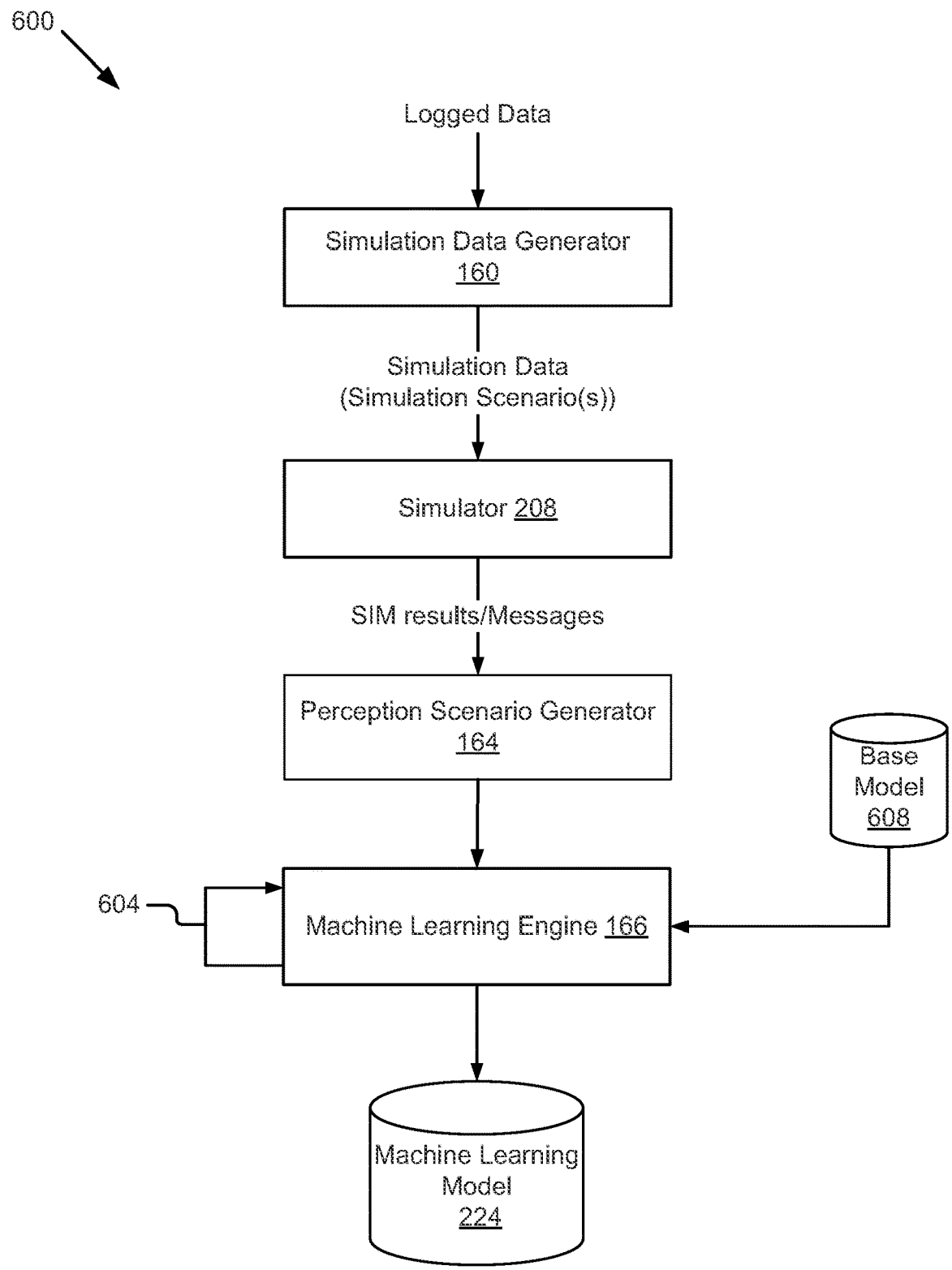
FIG. 6 is a flow chart illustrating a process for generating a perception model according to some implementations.

Referring now to FIG. 6, a block diagram illustrating an example of a data flow through the simulation data generator 160, the simulator 208, the perception scenario generator 164, and the machine learning engine 166 will be described. The logged data is received by the simulation data generator 160, which generates simulation data (e.g., one or more simulation scenarios). The simulator 208 receives simulation data or simulation scenario as has been described above and executes a simulation based on the simulation scenario. This may include simulations to evaluate components of the autonomous vehicle 100, such as a simulation of a perception subsystem 154 or a planning subsystem 156. The execution of the simulation generates simulation results or messages encoded with state information associated with the behavior of the autonomous vehicle 100 and other actors in the simulation scenario. In some implementations, the simulation results/messages from the simulator 208 are provided to the perception scenario generator 164 as has been described above with reference to FIG. 5. The perception scenario generator 164 receives the simulation results/messages and generates one or more perception scenarios. The perception scenario generator 164 automatically creates one or more perception scenarios from the simulated results. For example, the perception scenario can be directed to simulating the operation of a lidar sensor, a radar sensor, a camera or any other sensor of the autonomous vehicle 100. In some implementations, the perception scenario generator 164 also validates the one or more perception scenarios by verifying that a constraint is satisfied to produce a validated perception scenario. Once generated, the one or more perception scenarios are used as a source of training data for a machine learning engine 166 used to train machine learning model 224, specifically a perception model. Again, for example, the perception model may part of the perception subsystem 154, and a model of processing input from a lidar sensor, a radar sensor, a camera or any other sensor of the autonomous vehicle 100. The machine learning engine 166 retrieves a base model 602 and uses the simulation data to train the base model 602 and generate a trained machine learning model 224, the perception model. The simulation data may be repeatedly and iteratively used to improve the accuracy of the machine learning model 224 as represented by line 604 to and from the machine learning engine 166 in FIG. 6. More specifically, the one or more perception scenarios may also be used for re-training or refinement of the machine learning model 224. The improved machine learning model 224 can in turn be used by the perception subsystem 154, for example. Various other specific parameters of any of the machine learning models 224 for perception, location, planning or control may be similarly trained or refined using validated data generated specifically for a particular parameter by the computing system 172.

In some implementations, the machine learning engine 166 may generate training instances to train a neural network model. For example, in some implementations, the one or more perception scenarios may be used by machine learning engine 166 to generate updates with respect to a base model 608. In some implementations, the simulation results are used to generate a predicted output of the machine learning model 224, which is then used to update one or more weights in the machine learning model 224 by determining a difference between the predicted output and a simulated output.

In some implementations, the machine learning model 224 is a neural network model. Additionally, or alternatively, the neural network engine 166 may compare the predicted neural network model output with a neural network model known output (e.g., simulated output generated from a perception scenario) from the training instance and, using the comparison, update one or more weights in the neural network model. In some implementations, one or more weights may be updated by backpropagating the difference over the entire neural network model.

In a variety of implementations, a neural network model can be trained using supervised learning, unsupervised learning, and semi-supervised learning. Additionally, or alternatively, neural network models in accordance with some implementations can be deep learning networks including recurrent neural networks, convolutional neural networks, networks that are a combination of multiple networks, etc.

In some implementations, the selection of the logged data and the manipulations performed by the augmentation engine 204 may be selected to further one or more aspects of training the machine learning model 224.

In some implementations, one or more aspects of the perception scenario may be selected to aid in generating a wider variety of instances of training data. For example, one or more scenarios may have a configurable range of variations in the speed of actors selected to increase the variety of training data used to train the machine learning model 224. As a simple example, varying the speed of actors in a scenario may be useful to train the machine learning model 224 to make one or more predictions over a range of actor speeds that may not have occurred in the original logged data. As another example, changing the actor type in a scenario may be useful to train the machine learning model 224 to make predictions over a range of actor types that may not have occurred in the original logged data.

As an illustrative but non-limiting example, increasing the speed of actors may be useful for a variety of purposes, such as generating simulations indicative of how well a simulated perception subsystem 154 makes predictions for different scenarios, such as making predictions about the detection of simulated actors or the detection of attributes of simulated actors (e.g., a detection of the brake lights of a simulated actor). For example, increasing a speed of an actor or changing it to a different actor type (e.g., changing it from a truck to a motorcycle) may pose a greater detection challenge to a perception subsystem 154. Similarly, changing the actor type in a scenario the behavioral response of an actor, such as changing its perception range or intelligence, may be useful for generating simulations to test how well a planning subsystem 156 makes predictions for responding to different situations.

As another illustrative but non limiting example, changing any aspect of a perception sensor or configuration in a perception scenario such as the type, number, position, etc. may be useful for generating simulations to test how well the perception subsystem 154 detects objects and actors. For example, different perception scenarios for a lidar sensor, a radar sensor, a camera or any other sensor of the autonomous vehicle may be added and use to generate or retrain the perception model.

Figure 7:
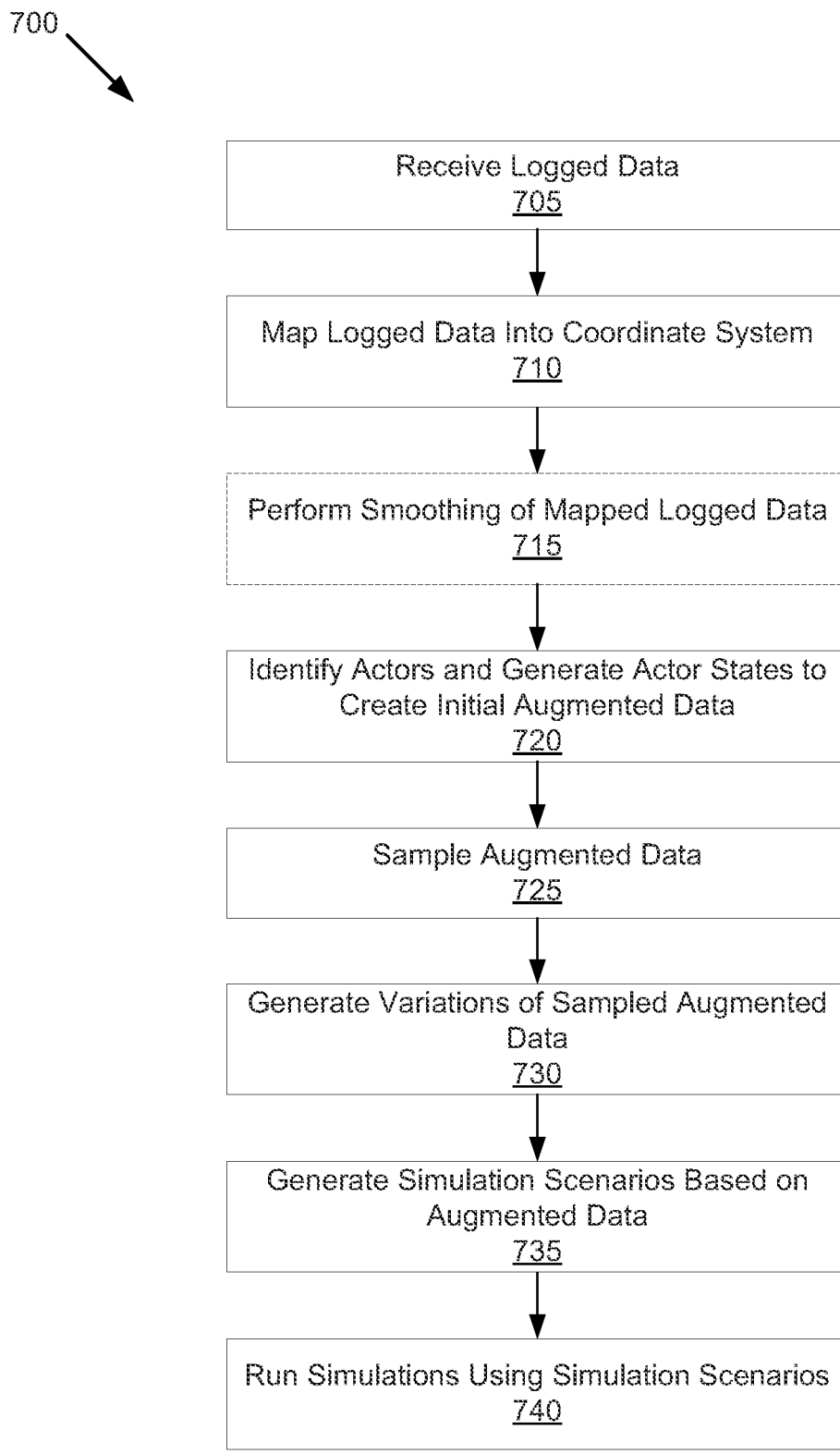
FIG. 7 is a flow chart illustrating a method of using logged data to generate simulated data according to some implementations.

FIG. 7 illustrates a flowchart of a method 700 in accordance with some implementations. In block 705, logged data 214 is received or retrieved. As noted above, for example, the logged data 214 may include raw sensor data from any one or more of the sensors 130, state or localization data from localization subsystem 152, state or perception data from perception subsystem 154, state or planning data from the planning subsystem 156 or state or control data from the control subsystem 158. In some examples, the logged data is received as it is collected. In other examples, the logged data 214 is retrieved from the data storage 280. In block 710, the logged data 214 is mapped into a coordinate system of a simulation. In some implementations, the logged data 214 is mapped into global coordinates in order to map the motion of the ego-vehicle and actors in the global coordinate system. An example coordinate system is an orthogonal curvilinear coordinate (OCC) system. In block 715, optional smoothing is performed of the mapped logged data to generate smoothed data. This may include noise-filtering or interpolation as examples. The smoothed data or the mapped logged data is then used to create the augmented data. In block 720, in some implementations, the method 700 identifies actors and generates actor states to create initial augmented data. For example, initial actor information is identified from the mapped and smoothed logged data. This may include one or more rules regarding identifying actors based on verifying that an actor occurs in a meaningful number and frequency of instances of the logged data. In some implementations, the identified actors are fit to a movement model to estimate their movement. This creates an initial form of the augmented data. In block 725, the initial augmented data of block 720 is sampled. For example, not all of the initial actor information may be required to generate a variation of the augmented data. For example, it may be desired to vary aspects of individual actors. So individual actors can be sampled, certain behaviors can be sampled, or locations, poses, other variables in the simulation can be sampled from the full set of logged data 214 that has been converted to the initial augmented data. In block 730, one or more variations of the sampled augmented data are generated. For example, configuration variables may be used to define the one or more variations. It should be noted that block 730 includes generating a plurality of sets of sampled augmented data where each set of sampled data corresponds to a variation in one or more actors and one or more characteristics or behavior. In block 735, one or more simulation scenarios are generated based on the augmented data and its variations. For example, one simulation scenario may be generated for each set of sampled augmented data. In block 740, one or more simulations are run using the one or more simulation scenarios.

Figure 8A:
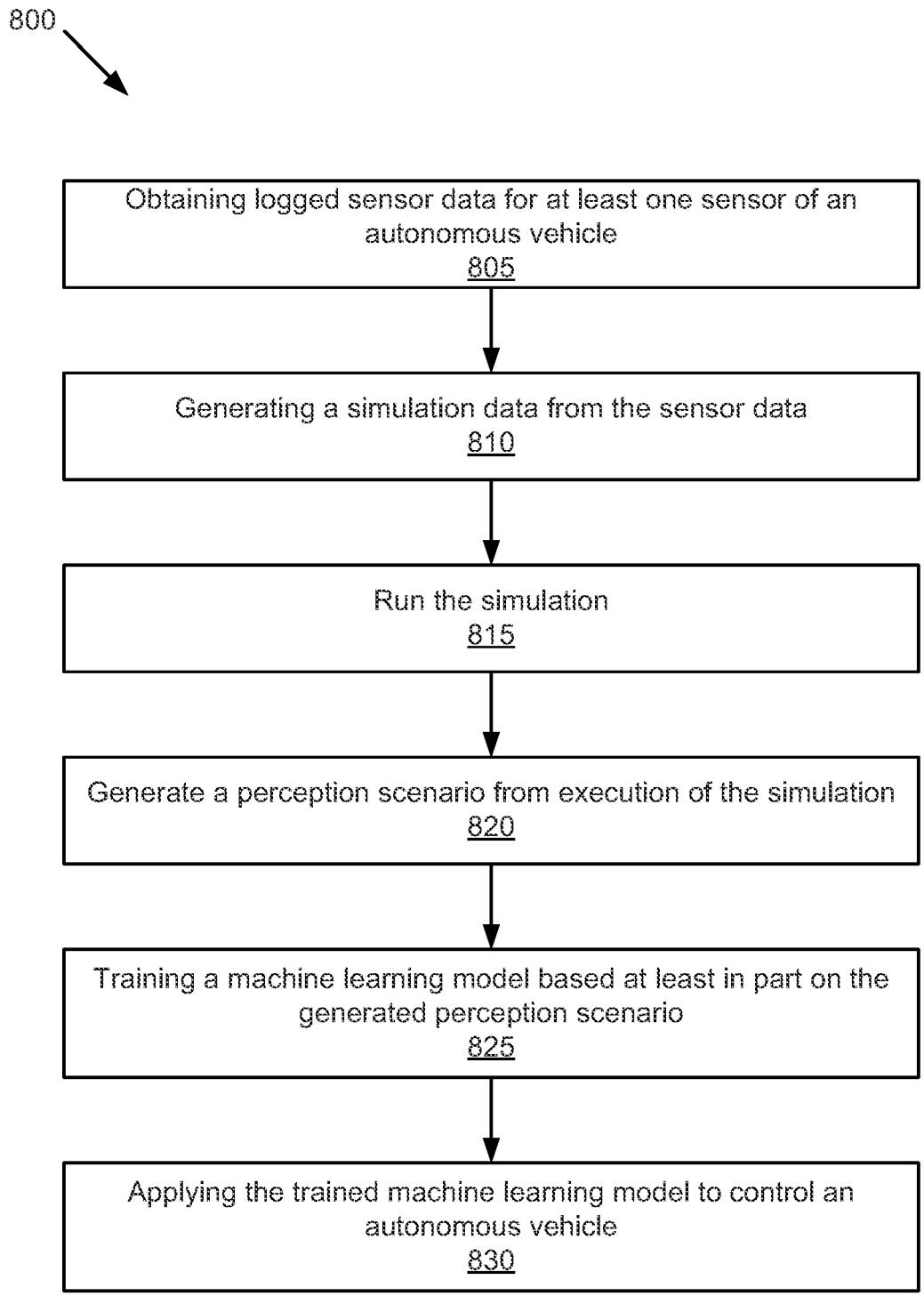
FIGS. 8A and 8B are flow charts illustrating example methods of using perception scenarios to generate a perception model for use in an autonomous vehicle according to some implementations.

FIG. 8A is a flow chart illustrating a general method 800 of using perception scenarios to generate a machine learning model 224, a perception model, for use in the autonomous vehicle 100 in accordance a first implementations. In block 805, logged data including sensor data is obtained from at least one sensor of an autonomous vehicle 100. For example, the logged data may take the form of time-stamped logged data. The logged data may include, for example, localization data and tracking data that is time stamped, although more generally it may also include other vehicle data or specific sensor data.

In block 810, simulation data is generated based on the sensor data. This may include transforming the sensor data into a coordinate system of a simulation and performing data smoothing. This may, in some implementations, include generating metadata or performing formatting to facilitate access and used by other software entities. This may also include generating augmented data 216 from the logged data and generating one or more simulation scenarios as simulation data based on the augmented data 216.

In block 815, simulation data is used to run a simulation. The simulations are executed using one or more simulation scenarios to produce simulation data including simulation results and/or messages.

In block 820, one or more perception scenarios are generated from the execution of the simulation. The perception scenario generator 164 produces the one or more perception scenarios from the simulation results and/or messages.

In block 825, a machine learning model 224, e.g., the perception model, is generated or re-trained based at least in part on the one or more perception scenarios.

In block 830, the trained machine learning model is applied to control an autonomous vehicle 100. For example, during operation of the autonomous vehicle 100, the trained machine learning model 224 may be used in a vehicle control system 120. More specifically, the perception model is used by the perception subsystem 154 in part to control the operation of the autonomous vehicle 100.

Figure 8B:
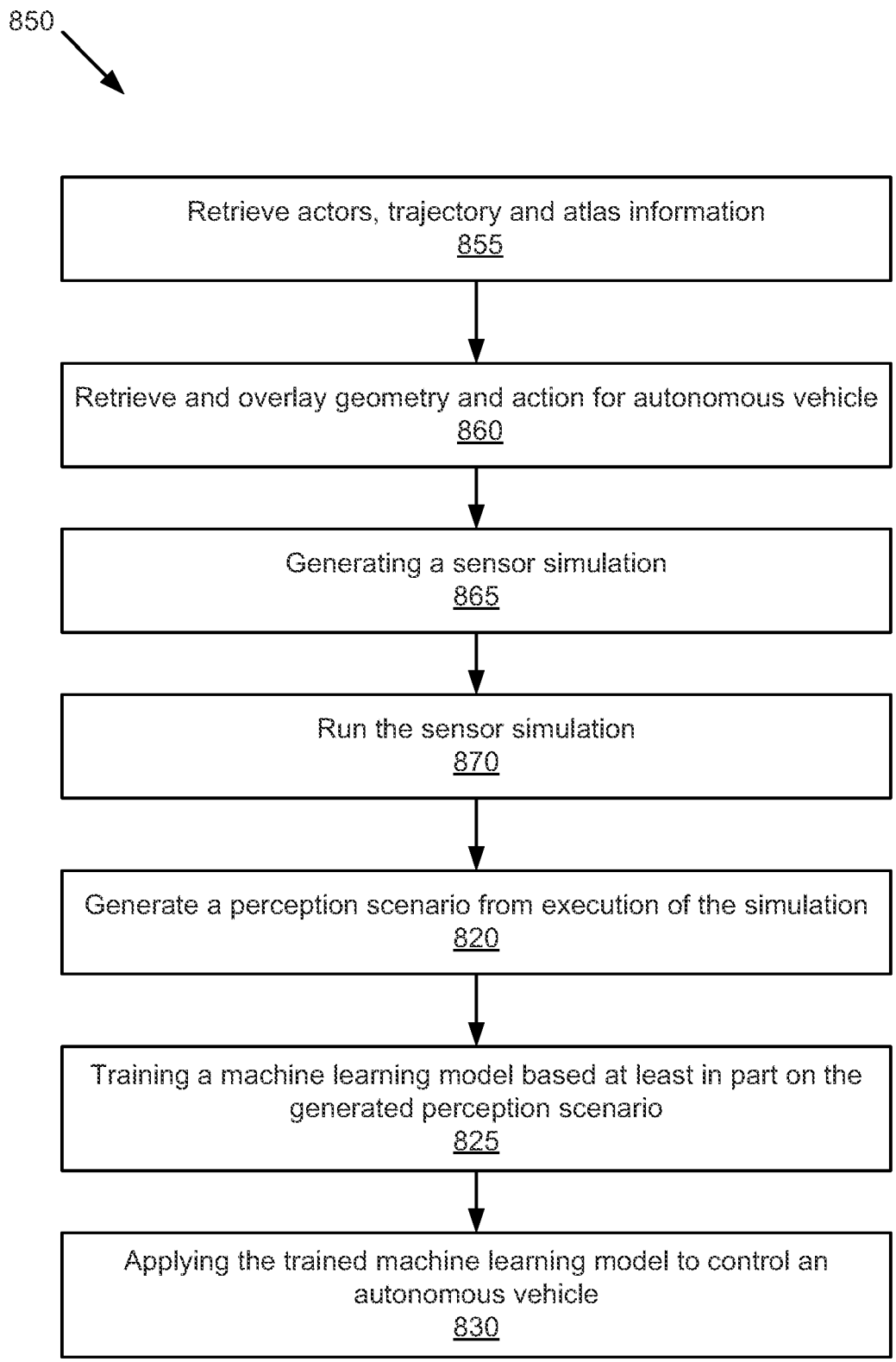

FIG. 8B is a flow chart illustrating a method 850 of using scenarios to generate a machine learning model 224, a perception model, for use in the autonomous vehicle 100 in accordance a second implementations. The method 850 begins with by retrieving information about actors, trajectory, and atlas information. For example, information about one or more actors, the action or behavior they will follow and their position on the road are retrieved for inclusion in the simulation. The trajectory information may include a route or breadcrumbs for a path. The road information may include an atlas, real or synthetic. Next, the method 850 retrieves and overlays 860 the geometry, action and other information of the autonomous vehicle 100 with the information retrieved in block 855. The information may include a planner for the autonomous vehicle 100 as has been described above.

In block 865, the information from blocks 855 and 860 are used to generated a sensor simulation scenario.

In block 870, the generated sensor simulation scenario is used to run a sensor simulation. The simulations are executed using one or more simulation scenarios to produce simulation data including simulation results and/or messages.

In block 820, one or more perception scenarios are generated from the execution of the simulation. The perception scenario generator 164 produces the one or more perception scenarios from the simulation results and/or messages.

In block 825, a machine learning model 224, e.g., the perception model, is generated or re-trained based at least in part on the one or more perception scenarios.

In block 830, the trained machine learning model is applied to control an autonomous vehicle 100. For example, during operation of the autonomous vehicle 100, the trained machine learning model 224 may be used in a vehicle control system 120. More specifically, the perception model is used by the perception subsystem 154 in part to control the operation of the autonomous vehicle 100.

The previous description is provided to enable practice of the various aspects described herein. Various modifications to these aspects will be understood, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of blocks in the processes disclosed is an example of illustrative approaches. Based upon design preferences, it is understood that the specific order or hierarchy of blocks in the processes may be rearranged while remaining within the scope of the previous description. The accompanying method claims present elements of the various blocks in a sample order, and are not meant to be limited to the specific order or hierarchy presented.

The previous description of the disclosed implementations is provided to enable others to make or use the disclosed subject matter. Various modifications to these implementations will be readily apparent, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the blocks of various examples must be performed in the order presented. As will be appreciated, the order of blocks in the foregoing examples may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the examples disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In some examples, the functions described may be implemented in hardware, software, firmware, or any combination thereof. If implemented in software, the functions may be stored as one or more instructions or code on a non-transitory computer-readable storage medium or non-transitory processor-readable storage medium. The blocks of a method or algorithm disclosed herein may be implemented in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable others to make or use the present disclosure. Various modifications to these examples will be readily apparent, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for an autonomous vehicle, the method comprising:
   receiving simulation data including the autonomous vehicle, the simulation data generated based on random sampling of snippets of logged data from a set of snippets of logged data associated with real-world driving, the random sampling of snippets of logged data based on an identifier identifying a specific characteristic in a snippet of logged data;
   executing a first simulation of a planning subsystem of the autonomous vehicle based on the simulation data to generate a simulation result;
   executing a second simulation of a perception subsystem of the autonomous vehicle using the simulation result as an input to generate an amended simulation result including ground truth data based on dynamic state information of one or more actors in the second simulation;
   generating a perception scenario using the amended simulation result; and
   validating the perception scenario by verifying whether a constraint is satisfied to produce a validated perception scenario.

2. The method of claim 1, further comprising:
   providing the validated perception scenario as a training input to machine learning engine to generate a perception model and a predicted output of the perception model; and
   updating one or more weights in the perception model based on a difference between the predicted output and the amended simulation result.

3. The method of claim 2, wherein the perception scenario is for a lidar sensor of the autonomous vehicle, and the perception model is for the lidar sensor.

4. The method of claim 2, wherein the perception scenario is for a radar sensor of the autonomous vehicle and the perception model is for the radar sensor.

5. The method of claim 2, wherein the perception scenario is for a camera of the autonomous vehicle and the perception model is for the camera.

6. The method of claim 1, wherein the perception scenario is for a plurality of sensors of the autonomous vehicle, and the plurality of sensors are from a group of a lidar sensor, a radar sensor and a camera.

7. The method of claim 1, wherein the validating the perception scenario verifies a tracking constraint.

8. The method of claim 1, wherein the simulation data is generated from logged sensor data.

9. The method of claim 8, wherein the logged sensor data is from a plurality of sensors.

10. The method of claim 1, wherein the simulation data is generated from data from a simulation or a video game.

11. A system comprising one or more processors and memory operably coupled with the one or more processors, wherein the memory stores instructions that, in response to the execution of the instructions by one or more processors, cause the one or more processors to perform the following operations:
receiving simulation data including an autonomous vehicle, the simulation data generated based on random sampling of snippets of logged data from a set of snippets of logged data associated with real-world driving, the random sampling of snippets of logged data based on an identifier identifying a specific characteristic in a snippet of logged data;
executing a first simulation of a planning subsystem of the autonomous vehicle based on the simulation data to generate a simulation result;
executing a second simulation of a perception subsystem of the autonomous vehicle using the simulation result as an input to generate an amended simulation result including ground truth data based on dynamic state information of one or more actors in the second simulation;
generating a perception scenario using the amended simulation result; and
validating the perception scenario by verifying whether a constraint is satisfied to produce a validated perception scenario.

12. The system of claim 11, wherein the operations further comprise:
providing the validated perception scenario as a training input to machine learning engine to generate a perception model and a predicted output of the perception model; and
updating one or more weights in the perception model based on a difference between the predicted output and the amended simulation result.

13. The system of claim 12, wherein the perception scenario is for a lidar sensor of the autonomous vehicle, and the perception model is for the lidar sensor.

14. The system of claim 12, wherein the perception scenario is for a radar sensor of the autonomous vehicle and the perception model is for the radar sensor.

15. The system of claim 12, wherein the perception scenario is for a camera of the autonomous vehicle and the perception model is for the camera.

16. The system of claim 11, wherein the perception scenario is for a plurality of sensors of the autonomous vehicle, and the plurality of sensors are from a group of a lidar sensor, a radar sensor and a camera.

17. The system of claim 11, wherein the validating the perception scenario verifies a tracking constraint.

18. The system of claim 11, wherein the simulation data is generated from logged sensor data and the logged sensor data is from a plurality of sensors.

19. The system of claim 11, wherein the simulation data is generated from data from a simulation or a video game.

20. A non-transitory computer readable storage medium storing computer instructions executable by one or more processors to perform a method of generating a perception model for an autonomous vehicle, the method comprising:
receiving simulation data including the autonomous vehicle, the simulation data generated based on random sampling of snippets of logged data from a set of snippets of logged data associated with real-world driving, the random sampling of snippets of logged data based on an identifier identifying a specific characteristic in a snippet of logged data;
executing a first simulation of a planning subsystem of the autonomous vehicle based on the simulation data to generate a simulation result;
executing a second simulation of a perception subsystem of the autonomous vehicle using the simulation result as an input to generate an amended simulation result including ground truth data based on dynamic state information of one or more actors in the second simulation;
generating a perception scenario using the amended simulation result; and
validating the perception scenario by verifying whether a constraint is satisfied to produce a validated perception scenario.

* * * * *